US009494017B2

United States Patent
Garibaldi

(10) Patent No.: US 9,494,017 B2
(45) Date of Patent: Nov. 15, 2016

(54) DETERMINING APPRAISAL LOCATIONS IN A RESERVOIR SYSTEM

(71) Applicant: Landmark Graphics Corporation, Houston, TX (US)

(72) Inventor: Luis Arnoldo Garibaldi, Katy, TX (US)

(73) Assignee: Landmark Graphics Corporation, Houston, TX (US)

(*) Notice: Subject to any disclaimer, the term of this patent is extended or adjusted under 35 U.S.C. 154(b) by 0 days.

(21) Appl. No.: 14/646,454

(22) PCT Filed: Nov. 7, 2014

(86) PCT No.: PCT/US2014/064583
§ 371 (c)(1),
(2) Date: May 21, 2015

(87) PCT Pub. No.: WO2015/112233
PCT Pub. Date: Jul. 30, 2015

(65) Prior Publication Data
US 2015/0369018 A1    Dec. 24, 2015

Related U.S. Application Data

(60) Provisional application No. 61/931,319, filed on Jan. 24, 2014.

(51) Int. Cl.
G06G 7/48       (2006.01)
E21B 41/00      (2006.01)
E21B 43/00      (2006.01)
E21B 43/30      (2006.01)

(52) U.S. Cl.
CPC ........... *E21B 41/0092* (2013.01); *E21B 43/00* (2013.01); *E21B 43/30* (2013.01)

(58) Field of Classification Search
CPC .................. E21B 41/0092; E21B 43/30; E21B 43/00
USPC ......................................................... 703/10
See application file for complete search history.

(56) References Cited

U.S. PATENT DOCUMENTS

| 7,096,172 B2 | 8/2006 | Colvin et al. |
| 2007/0199721 A1 | 8/2007 | Givens et al. |
| 2008/0300793 A1 | 12/2008 | Tilke et al. |
| 2010/0179797 A1 | 7/2010 | Cullick et al. |
| 2011/0060573 A1 | 3/2011 | Cullick et al. |

OTHER PUBLICATIONS

J.B. Gustavson and D.J. Murphy; Risk Analysis in Hydrocarbon Appraisals, SPE 18905; dated 1989; 12 pages; SPE; Texas.
Dave E. Reese and John C. Currie; Yit-Seng Chow and Mukul R. Bhatia; Appraisal and Development Planning, SPE 38064; dated 1997; 14 pages; SPE; Texas.
Gatta, S.R., Project Priority Ranking Process; SPE 81551; dated 2003; 12 pages; SPE; Texas.
William J. Haskett,; Optimal Appraisal Well Location Through Efficient Uncertainly Reduction and Value of Information Techniques; SPE 84241; dated 2003; 7 pages; SPE; Texas.

(Continued)

*Primary Examiner* — Saif Alhija
(74) *Attorney, Agent, or Firm* — Crain, Caton & James; Tenley Krueger

(57) ABSTRACT

System and methods for determining appraisal locations in a reservoir system by generating, selecting and ranking a list of priority appraisal locations based on an adjusted hydrocarbon recovery potential.

20 Claims, 13 Drawing Sheets

(56) References Cited

OTHER PUBLICATIONS

Suleiman Al Kindi, Markus Weissenback, Sultan Mahruqi, Joe Cutino, Hisham Al Siyabi,; Appraisal Strategy for a Tight Gas Discovery; SPE 142735; dated 2011; 7 pages; SPE; Texas.

E. Niz-Velasquez, M.L. Trujillo and C. Delgadilllo, J. Padilla,; A Methodology for Screening and Ranking of Reservoirs for Light Oil Air Injection Implementation; SPE-169951-MS; dated 2014; 13 pages ; SPE; Texas.

Scott Evans,; A Modern Approach to E & P Asset Evaluation, Development, and Decision Making; dated Jul. 1, 2005; 3 pages; SPE Journal Paper; Texas.

Richard J. Miller,; Evaluation of Risk in Appraisals of Large-Scale Development Projects for Financing Purposes; SPE 6331; dated 1977; 10 pages; SPE; Texas.

A.B. Zolotukhin,; A New Approach to Decision Making in Reservoir Engineering; SPE 22356; dated 1992; 8 pages; SPE; Texas.

C.S. Kabir, S.B. Gorell, M.E. Portillo, and A.S. Cullick,; Decision Making with Uncertainly While Developing Multiple Gas/Condensate Reservoirs: Well Count and Pipeline Optimization; dated Jun. 2007; SPE Reservoir Evaluation & Engineering; Texas.

John Smyth, Piotr Rusin, Jhairo Garcia and Stan Cullick,; Rapid Optimization of Development Scenarios for Multiple Exploration Prospects Using an Integrated Asset Model; dated 2010; 21 pages; SPE; Texas.

E. Caselgrandi, G. Cavanna, E. Corti, E.L. Della Rossa, M.E. Rovellini , Y. Suhardiman , A. Cercutti, C. Sugama; Reservoir Risk Assessment in Turbiditic Slope Channels: A Case Study from the Kutei Basin (Offshore Kalimantan, Indonesia); SPE 147732; dated 2011; 10 pages; SPE; Texas.

Berard, T., Liu Q., Dubost F.-X., and Jung B.,; A Screen Process for Shale Gas Prospecting; SPE 154736; dated 2012; 19 pages; SPE; Texas.

Commissioner; International Search Report and the Written Opinion of the International Searching Authority; PCT/US14/64583; Jan. 19, 2015; 10 pgs.; ISA/KR.

|  | Scenario 1 | Scenario 2 |
|---|---|---|
| Ref. Col. Loc. | 4 | 3 |
| Ref. Row Loc. | 3 | 2 |
| Vert. Spacing | 2 | 1 |
| Horz. Spacing | 3 | 1 |

Patterns:

Scenario 1:
|   | 1 | 2 | 3 | 4 | 5 |
|---|---|---|---|---|---|
| 1 | 1 | 0 | 0 | 1 | 0 |
| 2 | 0 | 0 | 0 | 0 | 0 |
| 3 | 1 | 0 | 0 | 1 | 0 |
| 4 | 0 | 0 | 0 | 0 | 0 |

Scenario 2:
|   | 1 | 2 | 3 | 4 | 5 |
|---|---|---|---|---|---|
| 1 | 0 | 0 | 0 | 0 | 0 |
| 2 | 1 | 0 | 1 | 0 | 1 |
| 3 | 0 | 0 | 0 | 0 | 0 |
| 4 | 1 | 0 | 1 | 0 | 1 |

|   | 1 | 2 | 3 | 4 | 5 |
|---|---|---|---|---|---|
| 1 | 1 | 1 | 3 | 2 | 1 |
| 2 | 0 | 1 | 0 | 2 | 1 |
| 3 |   | 0 | 0 | 0 | 0 |
| 4 |   |   |   | 2 | 1 |

FIG. 5

|   | 1 | 2 | 3 | 4 | 5 |
|---|---|---|---|---|---|
| 1 |   |   | 3 | 2 |   |
| 2 |   |   |   | 2 |   |
| 3 |   |   |   |   |   |
| 4 |   |   |   | 2 |   |

FIG. 6

|   | 1 | 2 | 3 | 4 | 5 |
|---|---|---|---|---|---|
| 1 |   |   | 2 | 1 |   |
| 2 |   |   |   | 3 |   |
| 3 |   |   |   |   |   |
| 4 |   |   |   | 3 |   |

FIG. 7

|   | 1 | 2 | 3 | 4 | 5 |
|---|---|---|---|---|---|
| 1 |   |   |   | 1 |   |
| 2 |   |   |   |   |   |
| 3 |   |   |   |   |   |
| 4 |   |   |   | 3 |   |

FIG. 8

| Sequence | Rank.Fact.AHRP | AHRP, MMstb | Loc. X | Loc. Y |
|---|---|---|---|---|
| 1 | 0.64 | 28 | X1 | Y1 |
| 2 | 0.59 | 32 | X2 | Y2 |
| ⋮ | | ⋮ | ⋮ | ⋮ |
| n | Lowest Adj. AHRP | AHRP value | Xn | Yn |
| | | Total AHRP | | |

FIG. 9

DETERMINING APPRAISAL LOCATIONS IN A RESERVOIR SYSTEM

CROSS-REFERENCE TO RELATED APPLICATIONS

This Application claims priority from PCT Patent Application Serial No. PCT/US14/64583, filed on Nov. 7, 2014, which claims priority from U.S. Provisional Patent Application Ser. No. 61/931,319, filed on Jan. 24, 2014, which are incorporated herein by reference.

STATEMENT REGARDING FEDERALLY SPONSORED RESEARCH

Not applicable.

FIELD OF THE DISCLOSURE

The present disclosure generally relates to systems and methods for determining appraisal locations in a reservoir system. More particularly, the present disclosure relates to determining appraisal locations in a reservoir system by generating, selecting and ranking a list of priority appraisal locations based on an adjusted hydrocarbon recovery potential.

BACKGROUND

Operators entering new prospect areas with little well control must make decisions on locating a limited number of exploratory wells. Large prospect areas can be characterized by a variety of different mineral rights, surface-permitting obligations, uncertainties in geologic subsurface characteristics, complexity of topography, a variety of available infrastructures, potential operational issues, and environmental and regulatory challenges. The decision to appraise an acreage position is thus, very complex and has a high level of risk.

BRIEF DESCRIPTION OF THE DRAWINGS

The present disclosure is described below with references to the accompanying drawings in which like elements are referenced with like reference numerals, and in which:

FIG. 5 is a map illustrating the frequency of the different appraisal locations in FIG. 4.

FIG. 6 is a map illustrating the different appraisal locations in FIG. 5 that represent critical decisions.

FIG. 7 is a map illustrating the different appraisal locations that represent critical decisions in FIG. 6 with a priority code.

FIG. 8 is a map illustrating the different appraisal locations with a priority code in FIG. 6 that honor predefined constraints.

FIG. 9 is a list illustrating an example of the different appraisal locations after they are ranked.

DETAILED DESCRIPTION OF THE PREFERRED EMBODIMENTS

Figure 1:
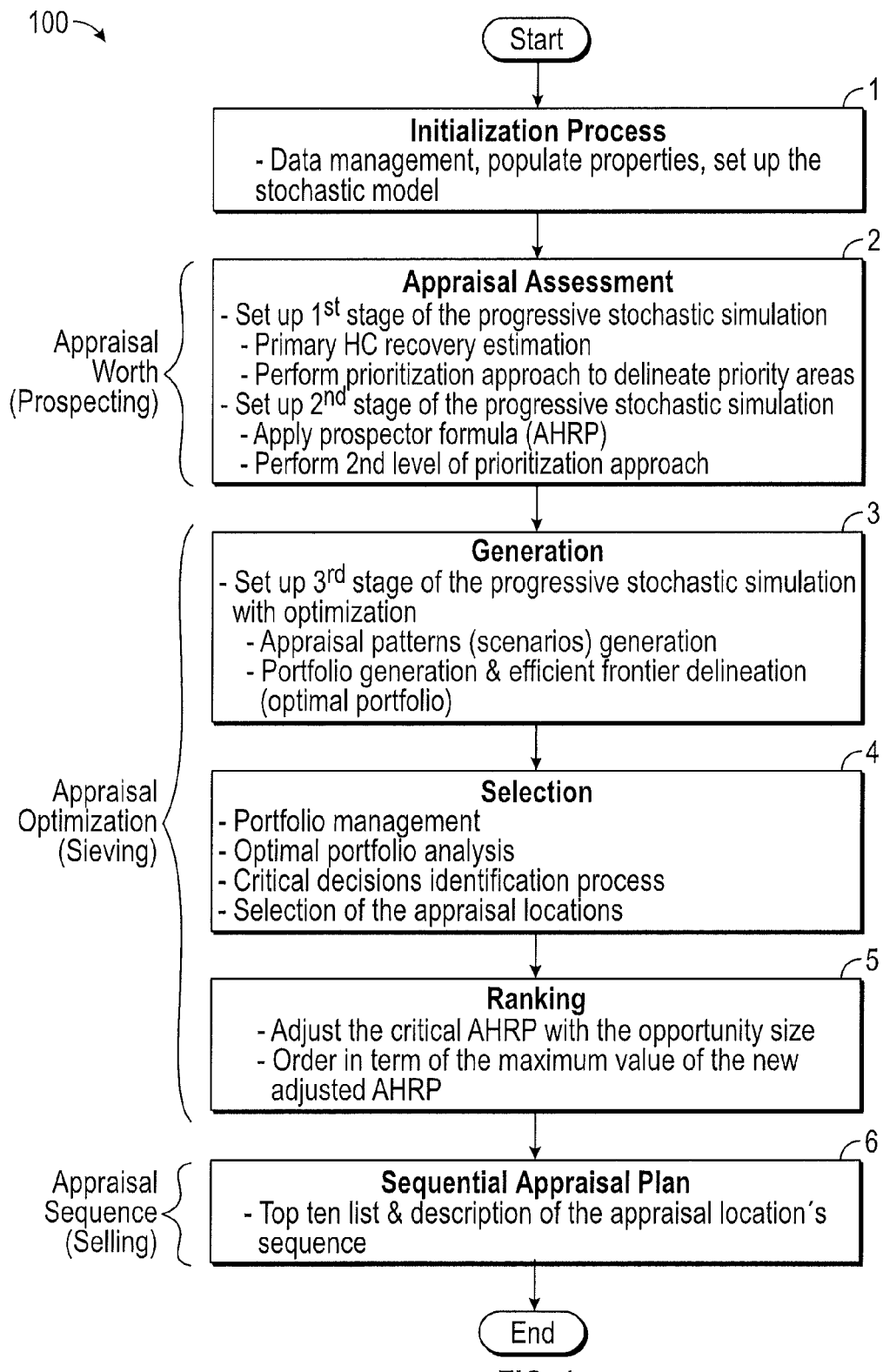
FIG. 1 is a flow diagram illustrating one embodiment of a method for implementing the present disclosure.

The present disclosure overcomes one or more deficiencies in the prior art by providing a system and methods for determining appraisal locations in a reservoir system by generating, selecting and ranking a list of priority appraisal locations based on an adjusted hydrocarbon recovery potential.

In one embodiment, the present disclosure includes a method for determining appraisal locations in a reservoir system, which comprises: i) creating a geocellular model using a computer processor; ii) defining a first priority area for the geocellular model using predetermined priority rule levels and one of a plurality of hydrocarbon recovery production values determined by a first simulation; iii) defining a second priority area for the geocellular model using predetermined priority rule levels and one of a plurality of adjusted hydrocarbon recovery production values determined by a second simulation based on the first priority area, wherein the second priority area is constrained by the first priority area; iv) defining an optimal portfolio for one or more appraisal patterns determined by a third simulation based on the second priority area using one of a plurality of objective function values determined by the third simulation, wherein the optimal portfolio is constrained by the second priority area; v) identifying common appraisal locations in the optimal portfolio; vi) calculating a ranking value for each respective common appraisal location using a respective critical risk and opportunity size; vii) discretizing each ranking value by predetermined priority levels; viii) removing each of the common appraisal locations inside a predetermined coverage area that do not have a highest priority level, the common appraisal locations inside the predetermined coverage area that have the highest priority level representing all remaining common appraisal locations; and ix) creating a sequential appraisal plan using the remaining common appraisal locations and at least one of available drilling activity and drilling capacity for a specified interest period of the sequential appraisal plan.

In another embodiment, the present disclosure includes a non-transitory program carrier device tangibly carrying computer-executable instructions for determining appraisal locations in a reservoir system, the instructions being executable to implement: i) creating a geocellular model; ii) defining a first priority area for the geocellular model using predetermined priority rule levels and one of a plurality of hydrocarbon recovery production values determined by a first simulation; iii) defining a second priority area for the geocellular model using predetermined priority rule levels and one of a plurality of adjusted hydrocarbon recovery production values determined by a second simulation based on the first priority area, wherein the second priority area is constrained by the first priority area; iv) defining an optimal portfolio for one or more appraisal patterns determined by a third simulation based on the second priority area using one of a plurality of objective function values determined by the third simulation, wherein the optimal portfolio is constrained by the second priority area; v) identifying common appraisal locations in the optimal portfolio; vi) calculating a ranking value for each respective common appraisal location using a respective critical risk and opportunity size; vii) discretizing each ranking value by predetermined priority levels; viii) removing each of the common appraisal locations inside a predetermined coverage area that do not have a highest priority level, the common appraisal locations inside the predetermined coverage area that have the highest priority level representing all remaining common appraisal locations; and ix) creating a sequential appraisal plan using the remaining common appraisal locations and at least one of available drilling activity and drilling capacity for a specified interest period of the sequential appraisal plan.

In yet another embodiment, the present disclosure includes a non-transitory program carrier device tangibly carrying computer-executable instructions for determining appraisal locations in a reservoir system, the instructions being executable to implement: i) creating a geocellular model; ii) defining a first priority area for the geocellular model using predetermined priority rule levels and one of a plurality of hydrocarbon recovery production values determined by a first simulation; iii) defining a second priority area for the geocellular model using predetermined priority rule levels and one of a plurality of adjusted hydrocarbon recovery production values determined by a second simulation based on the first priority area, wherein the second priority area is constrained by the first priority area; iv) defining an optimal portfolio for one or more appraisal patterns determined by a third simulation based on the second priority area using one of a plurality of objective function values determined by the third simulation, wherein the optimal portfolio is constrained by the second priority area; v) identifying common appraisal locations in the optimal portfolio; vi) calculating a ranking value for each respective common appraisal location; vii) discretizing each ranking value by predetermined priority levels; viii) removing each of the common appraisal locations inside a predetermined coverage area that do not have a highest priority level, the common appraisal locations inside the predetermined coverage area that have the highest priority level representing all remaining common appraisal locations; ix) creating a sequential appraisal plan using the remaining common appraisal locations and at least one of available drilling activity and drilling capacity for a specified interest period of the sequential appraisal plan; and x) defining one or more appraisal delineation areas by the remaining common appraisal locations from the sequential appraisal plan.

The subject matter of the present disclosure is described with specificity, however, the description itself is not intended to limit the scope of the disclosure. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the present disclosure may be applied in the oil and gas industry, it is not limited thereto and may also be applied in other industries to achieve similar results.

Method Description

Referring now to FIG. 1, a flow diagram of one embodiment of a method 100 for implementing the present disclosure is illustrated. The method 100 is generally defined by three processes. The first process determines an appraisal worth or value by using a formula to find the adjusted hydrocarbon recovery potential ("AHRP"), which is referred to herein as prospecting. The second process determines appraisal optimization in three steps to generate, select and rank a list of priority appraisal locations, which is referred to herein as sieving. The third process determines an appraisal sequence to drill the appraisal location, which is referred to herein as selling.

In step 1, data is managed, properties are populated and stochastic models are initiated using techniques well-known in the art.

The Prospecting Process

In step 2, the prospecting process is defined by equation 1:

$$\text{AHRP} = [\text{HRP} - (\text{Surf Imp.} + \text{Op.Imp.} + \text{Well Imp.})] * \text{Opportunity Fact} \tag{1}$$

The terms are described as follows, which are expressed in MMstb:
AHRP: represents the adjusted hydrocarbon recovery potential, which indicates an adjusted value of hydrocarbon content for each area.
HRP: represents the hydrocarbon recovery potential for each area.
Surf. Imp.: represents the possible surface impact associated with the permitting, topography, and infrastructure costs.
Op. Imp.: represents the operational impact of the production delayed due to the permissions process.
Well Imp.: represents the impact of the total well costs (Drilling and Completion) in each area.
Opportunity Fact: represents the opportunity factor, which is the possible impact in terms of the growth opportunity and risk ratio of an area defined by a coverage area of at least about 2 miles from the appraisal location.
Each of these terms is defined as follows:
 The HRP in equation 1 is defined by equation 2.

$$\text{HRP} = [\text{OOIP} * \text{PrimFr}] \tag{2}$$

where OOIP is the original oil in place measured in stb and PrimFr is the primary recovery factor measured in fractions.
 The Surf. Imp. In equation 1 is defined by equation 3:

$$\text{Surf.Imp.} = [\text{Permit.Fact} + \text{Infraestr.Fact}] \tag{3}$$

where Permit. Fact is the permitting factor, which is expressed by equation 3.1:

$$\text{Permit.Fact.} = [\text{Well Total Np(Permit.Time)} * \text{Num.Wells}] * \text{PI Fact.} \tag{3.1}$$

Permit. Time is the total time represented by the combination of the surface and mineral rights options. This parameter will determine the impact due to the production delayed by the time that it takes during the permit process. The Table 1 shows an example of these options and the time in months that each combination can take. Sometimes, there are combinations that are not possible and they are shown as n/a (not applicable) in Table 1.

TABLE 1

Permitting Time Matrix

|  |  | Surface | | | |
|---|---|---|---|---|---|
|  |  | Fee | State | Tribal | Federal |
| Mineral | Fee | 1-2 mo | 5-6 mo | 6-7+ mo | n/a |
|  | State | n/a | n/a | n/a | n/a |
|  | Tribal | 6-7+ mo | 6-7+ mo | 6-7+ mo | n/a |
|  | Federal | n/a | n/a | n/a | 5-6 mo |

Well Total Np (Permit.Time) is a production potential impact on the total cumulative oil production (Total NP) from the well type deferred by the permitting time. Num. Wells is the number of wells that potentially will be necessary to develop the area. PI Fact. is the impact on the potential production due to special conditions in the subsurface area that can benefit the production like the proximity to a fault system. This value is determined as a weight factor by using production engineering and/or statistics from analogous developed fields.

Infrastr. Fact. is the impact that the lack of infrastructure in terms of access to the areas, the transportation, and land form, generate on the potential recovery, which is expressed by equation 3.2:

$$\text{Infrastr.Fact.} = [\text{Road fact.} + \text{Pipe fact.}] * \text{Topography fact.} \quad (3.2)$$

where Road Fact. is the cost impact by the unit cost needed to build accessibility to the areas;
Pipe Fact. is the cost impact by the unit cost needed to build the pipeline to the areas and Topography Fact. is the impact on the infrastructure due to special conditions at the surface (landform) that can increase the cost such as the proximity to a canyon. This value is determined as a weight factor by using production engineering and/or statistics from analogous developed fields. Road Fact. is expressed by equation 3.2.1:

$$\text{Road fact} = [\text{Relative distance to Road}] * \text{Unit Cost/Oil price} \quad (3.2.1)$$

where Relative distance to Road is the distance to the nearest to a road; Unit Cost is the road unitarian cost in US$/mile and Oil Price is the oil reference price established for economic analysis. Pipe Fact. is expressed by equation 3.2.2:

$$\text{Pipe fact} = [\text{Relative distance to Pipe}] * \text{Unit Cost/Oil price} \quad (3.2.2)$$

where Relative distance to Pipe is the relative distance to the nearest Pipeline; Unit Cost is the pipe unitarian cost in US$/mile and Oil Price is the oil reference price established for economic analysis.

The Op. Imp. in equation 1 is defined by equation 4:

$$\text{OP.Imp} = [\text{Permit Fact}] * \text{Operating Unit Cost/Oil price} \quad (4)$$

where Permit. Fact is the permitting factor expressed by equation 3.1; Operating Unit Cost is the operational unitarian cost in US$/stb and Oil Price is the oil reference price established for economic analysis.

The Well Imp. in equation 1 is defined by equation 5:

$$\text{Well.Imp} = [\text{Average Depth} * \text{Num Wells} * \text{Unit Cost/Oil price}] * \text{Topography Fact.} \quad (5)$$

where Average Depth is the average depth of the well type in the area in feet; Num. Wells is the possible total number of wells that can be drilled in the area; Unit Cost is the well unitarian cost in US$/ft.; Oil Price is the oil reference price established for economic analysis and Topography Fact. is the impact on the well cost due to special conditions at the surface (landform). This value is determined as a weight factor by using production engineering and/or statistics from analogous developed fields.

The Opportunity Fact in equation 1 is defined by equation 6:

$$\text{Opportunity Fact} = \frac{\text{Total } Opport. \text{ } OOIP \text{ @ coverage acreage area}}{\text{Total Risk } OOIP \text{ @ coverage acreage area}} \quad (6)$$

where Total Opport. OOIP @ coverage acreage area is the size of the opportunity defined by the uncertainty range that will positively impact the expectation of the OOIP, and Total Risk OOIP @ coverage acreage area is the size of the risk defined by the uncertainty range that will negatively impact the expectation of the OOIP. These ranges are defined by using 50% (P50) as a reference of the OOIP wherein the extremes of the range are defined by the Critical Risk (Per) and the Critical Opportunity (Pco). Critical risk is the percentile value of the objective variable below which the risk associated with all intrinsic parameters is null or negligible. Similarly, critical opportunity is the percentile value of the objective variable above which the opportunity associated with all intrinsic parameters is null or negligible. The Opportunity Fact is thus, an indicator of hydrocarbon content in the coverage area of the appraisal location.

The prospecting process in equation 1 is implemented in each element of the discrete exploratory system. The discretization of the exploratory system uses grid techniques, which are well-known in standard reservoir model engineering. Often the exploratory areas in USA are legally delineated by sections of 1 square mile then the Prospector formula could be applied in each section.

Each element of the prospecting process in equation 1 is managed by sampling rules defined in a stochastic simulation. This generates huge computational processing. Thus, to manage this issue in an efficient fashion, it is necessary to start with the evaluation of the first element in equation 1, which is expressed by equation 2, as the first stage of a progressive stochastic simulation. Then, a priority analysis is performed to simplify the model by using a "Pareto Analysis," which is a well-known statistical technique. The next stage of the progressive stochastic simulation ($2^{nd}$ stage in step 2) is to evaluate the other elements in equation 1 on the priority area defined in the first stage of the progressive stochastic simulation. In this case, the computational process is reduced because the model is simplified by considering just the priority area defined. The results of each stage are managed to create a new singular probabilistic variable, which will be used as an input in the next, third stage of progressive stochastic simulation. The probabilistic variables are modeled by using statistical distribution function techniques that are well-known in the art.

The Sieving Process

The Sieving process starts with the values generated by the prospecting process in equation 1 to generate, select and rank a list of priority appraisal locations.

In step 3, the generation of appraisal locations considers different patterns of appraisal locations and obtains a maximum possible coverage of acreage with minimum appraisal locations. A reference position inside the area is selected and then possible locations honoring spacing among the others appraisal locations are generated. The spacing is defined by vertical spacing and horizontal spacing from the reference position, which is defined by grid coordinates in terms of columns and rows. All of them are decisions to be considered in the optimization process. The combinations of the different alternatives of these decisions will generate different patterns and each of them will be treated as a scenario.

Figures 2, 3:
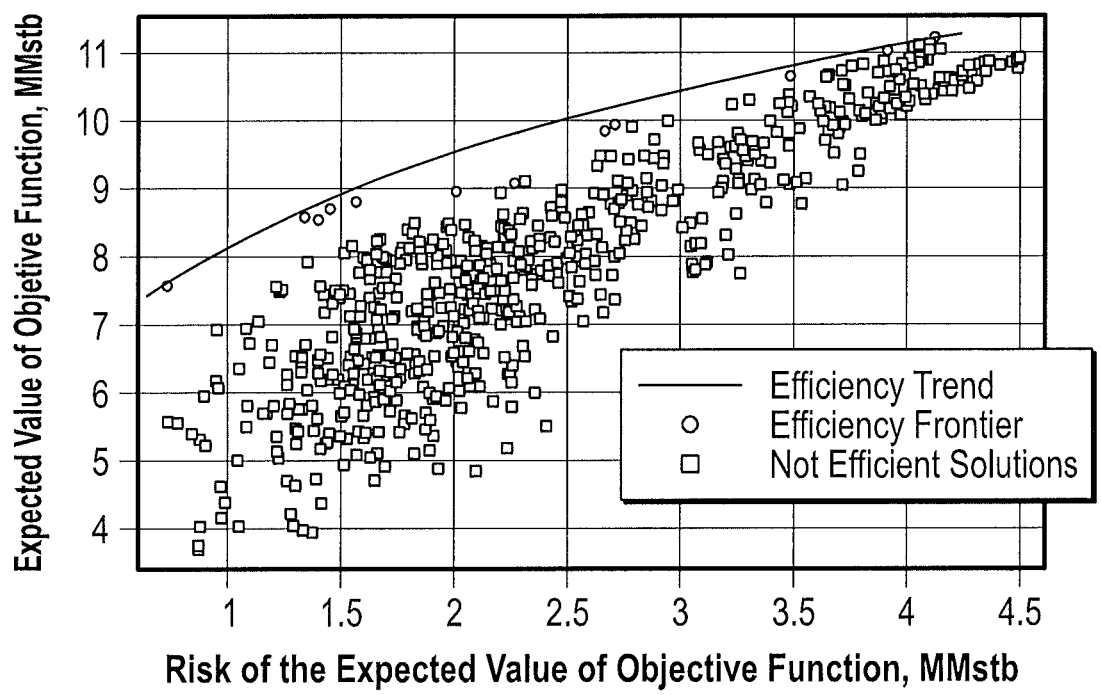
FIG. 2 is a chart illustrating examples of appraisal location patterns.
FIG. 3 is a graph illustrating optimal portfolio delineation.

FIG. 2 illustrates two particular scenarios as examples of appraisal location patterns generated by using specific options of the decisions variables used. These decision variables are the grid coordinates to define a reference initial position to start the generation of the locations pattern and spacing in the vertical and horizontal directions to generate the other locations necessary to accomplish the pattern. The appraisal locations are represented by the number 1. Scenario 1 shows one specific appraisal location pattern defined by a location reference represented by the boxed number 1 with grid coordinates (Col.=4, Row=3). Other locations are generated by honoring a vertical spacing of 2 miles (above and below the horizontal coordinate) and horizontal spacing of 3 miles (left and right of the vertical coordinate). In Scenario 1, therefore, four locations are generated. In Scenario 2, the location reference grid coordinates (3, 2) honor a vertical spacing of 1 mile and a horizontal spacing of 1 mile. In Scenario 2, therefore, six locations are generated.

The scenarios are generated following the rules defined in the optimization settings (step 3) as indicated by:

Decisions to be optimized:
  Grid coordinates for the reference position inside the priority area, obtained in the second stage of the progressive stochastic simulation:
    Decision on the X location ($X_D$)
    Decision on the Y location ($Y_D$).
  Decision variable for the horizontal spacing among the appraisal locations ($D_{hs}$).
  Decision variable for the vertical spacing among the appraisal locations ($D_{vs}$).
Uncertainties:
  The uncertainty variable is defined by the results of the evaluation of AHRP (equation 1) in the second stage of the progressive stochastic simulation, which are modeled with a statistical distribution function using techniques well-known in the art.
The objective function is to maximize the total value of AHRP from equation 1 on the set of appraisal locations generated by the pattern established in the priority area. The objective function is thus, defined by equation 7:

$$\text{Total Value of the Set of Appraisal Locations} = \sum_{i=1,D_{hs}}^{n} \sum_{j=1,D_{vs}}^{m} [AHRP(x_i, y_j)] \quad (7)$$

where AHRP is the result obtained in the second stage of the progressive stochastic simulation. The values are generated through the use of sampling rules techniques well-known in the art.

$x_i$: represents the horizontal grid coordinates.
$y_j$: represents the vertical grid coordinates.
n, m: represent maximum values of the grid coordinate.
$D_{hs}$: is an incremental value of $x_i$ and represents a decision on the horizontal spacing among the appraisal locations, in grid coordinates.
$D_{vs}$: is an incremental value of $y_i$ and represents a decision on the vertical spacing among the appraisal locations, in grid coordinates.

Constraints:
  The total value of equation 7 must be positive.
  The opportunity factor from equation 6 has to be bigger than 1.
  In the spacing decisions, the minimum value is about 2 miles.

The scenarios are collected and ordered by their expected value and their own risk to generate a portfolio of the appraisal location patterns, which is performed using well-known risk analysis techniques. The objective of step 3 is to delineate an optimal portfolio by using a well-known methodology of Portfolio Theory. This optimal portfolio is commonly known as Efficient Frontier. The optimal portfolio is determined by those scenarios that are on the optimal expected value zone at different risk levels as illustrated in FIG. 3 by the Efficiency Frontier points and the Efficiency Trend.

In step 4, the optimal portfolio delineated in the step 3 is represented by several scenarios, which in turn each represents a specific pattern of appraisal locations as described before. It means that this system generates multiple solutions at different risk levels. Thus, a special portfolio management has to be performed.

Figure 4:
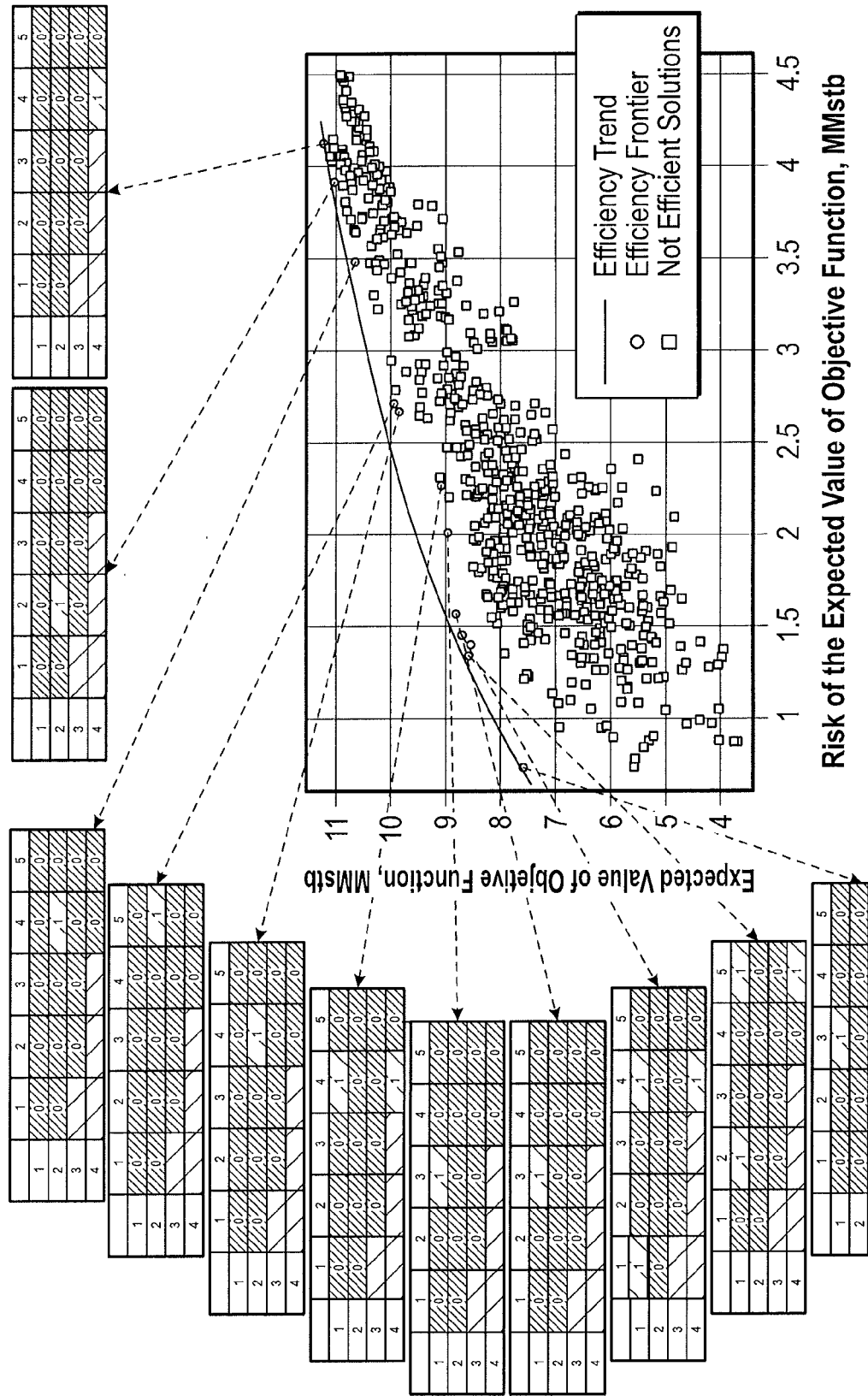
FIG. 4 is the graph in FIG. 3 illustrating the addition of different patterns of appraisal locations.

The appraisal location patterns have a fixed shape but the nature does not behave with this fixed shape. Thus, the best appraisal locations must be selected. Each of the scenarios that define the optimal portfolio represents different patterns of appraisal locations as illustrated in FIG. 4 and therefore, many of these appraisal locations are in the same place through these scenarios. Thus, they are common decisions throughout the optimal portfolio. These common decisions are referred to as critical decisions.

To identify the appraisal locations that represent critical decisions, a statistical analysis is performed to determine the frequency of each appraisal location that appears in each element of the grid.

FIG. 5 illustrates the frequency of the appraisal locations for each element of the grid generated from the example in FIG. 4. The empty space indicates no priority area and the zeroes indicate no appraisal location count for this element in the grid. The numbers 1 indicates just one appraisal location identified through the scenarios in FIG. 4, which are not critical decisions. The numbers 2 and 3 indicate common locations through the scenarios in the optimal portfolio. Therefore, these locations are considered critical decisions and will be taken into account to generate the list of the appraisal locations ranked in the following step. FIG. 6 illustrates the appraisal locations that represent critical decisions to be considered in the following step to generate the list of appraisal locations ranked.

In step 5, to rank the critical decisions, equation 8 is used to adjust AHRP and redefine the appraisal value:

$$\text{Rank.Fact.AHRP} = \frac{Wf}{\sqrt{(AHRP@Pcrit\_risk)^2 + (AHRP.Opport.Size)^2}} \quad (8)$$

where Rank.Fact.AHRP represents a ranking factor of the AHRP and Wf is a weight factor, which is a normalized frequency of the common appraisal locations through the scenarios selected in the Efficient Frontier. The normalized frequency is estimated by using techniques well-known in the art. AHRP@Pcrit_risk is the critical risk of the AHRP for each appraisal location that represents a critical decision and AHRP.Opport. Size is the size of the opportunity for AHRP in each appraisal location. The opportunity size of the AHRP in equation 8, is defined by equation 9:

$$\text{Opport.Size of AHRP} = \text{AHRP@Pcrit\_opport.} - \text{AHRP@Pcrit\_risk} \quad (9)$$

By applying equation 9, new adjusted values of AHRP are obtained and then a priority process (by using the "Pareto Analysis") is applied to discretize by 60:30:10 priority levels, the appraisal locations. Each appraisal location is mapped in a geographic map using its corresponding priority code and techniques well-known in the art. FIG. 7 illustrates the appraisal locations with a priority code. In FIG. 7, the priority code indicates the level of importance so 1 is the best and 3 is the worst. The ranking process finishes initiating the sequence analysis in the selling process.

The Selling Process

In step 6, the example in FIG. 7 shows appraisal locations that are inside of the threshold defined by constraints set up in step 3, about the radius of 2 miles as minimum spacing. Therefore, a new filter has to be applied to eliminate those locations that are not honoring this constraint as illustrated in FIG. 8 with the appraisal locations remaining after the filter process.

Then by using the adjusted AHRP from equation 9, the appraisal locations are ordered from highest value to the lowest value of Rank.Fact.AHRP to define the list of the appraisal locations ranked. FIG. 9 illustrates a particular example of the appraisal locations list.

The Total AHRP it the total summation of the values of AHRP at P50, obtained after equation 1 in the second stage of the progressive stochastic simulation described in step 2. The Total AHRP represents a potential estimation of the proven reserves to be booked after the appraisal delineation of the field. The method 100 is totally quantitative and integrates several procedures that previously were managed separately and in a qualitative form. The method 100 also uses a total stochastic approach and can be applied for different scale studies from a single well to corporate asset analysis of multiple wells.

Figure 10:
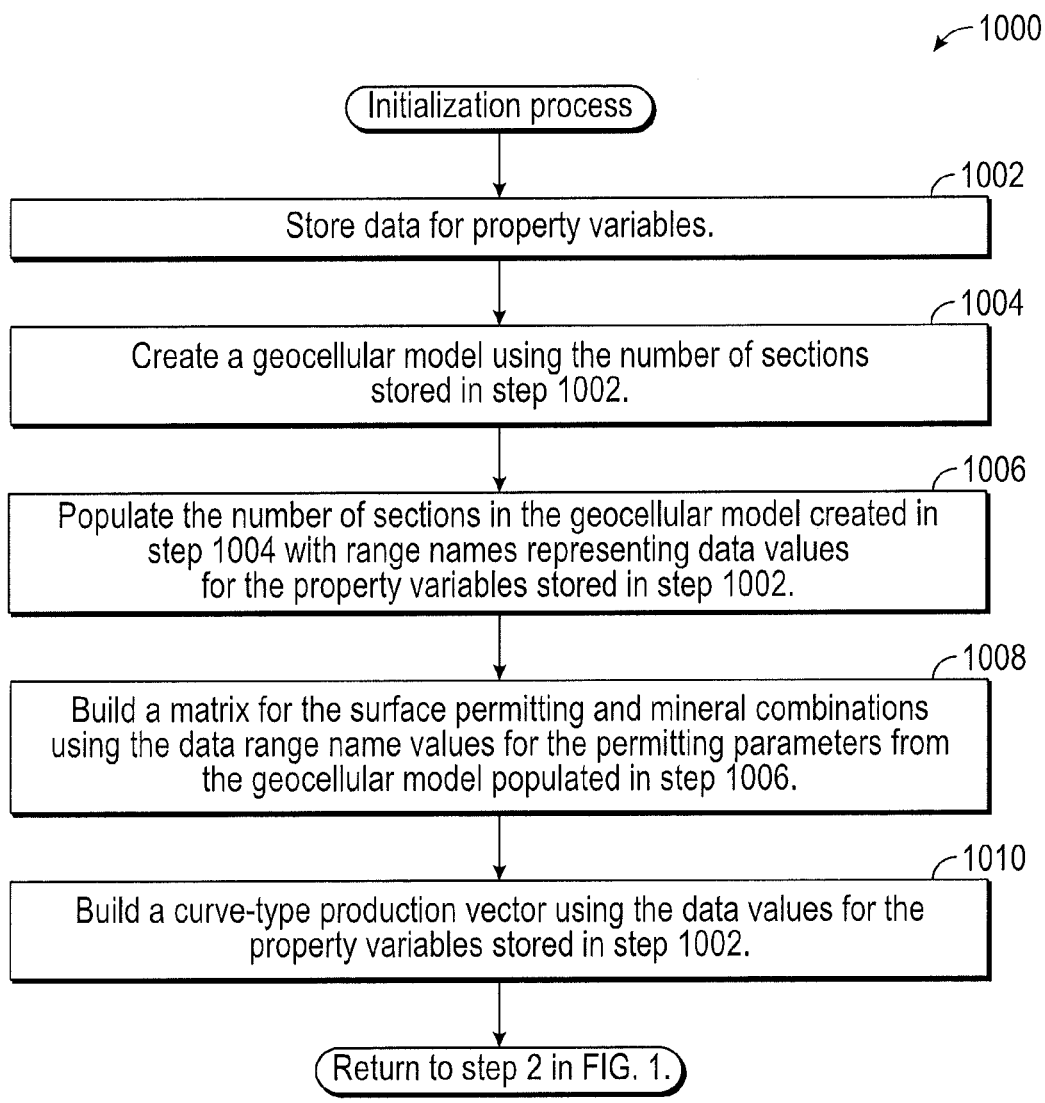
FIG. 10 is a flow diagram illustrating one embodiment of a method for performing step 1 in FIG. 1.

Referring now to FIG. 10, a flow diagram of one embodiment of a method 1000 for performing step 1 in FIG. 1 is illustrated.

Figure 16:
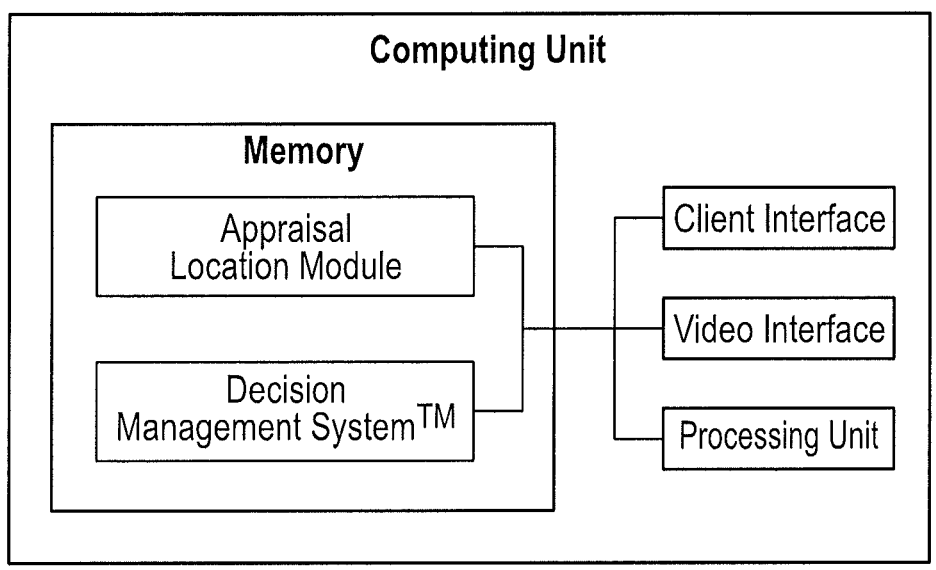
FIG. 16 is a block diagram illustrating one embodiment of a computer system for implementing the present disclosure.

In step 1002, data is stored using the client interface and/or the video interface described further in reference to FIG. 16 for the following property variables: i) Geological: area, porosity, thickness, initial water saturation (Swi), initial oil formation volume factor (Boi), faults trend, and structural average depth; ii) Recovery attribute: primary recovery; iii) Production: initial well production potential, decline factors, well, production time, production index, (PI) factor; iv) Costs: drilling and completion, roads, pipeline, operational; v) Maps: roads and pipeline; vi) Oil price; vii) Landform description parameters: surface permitting and mineral right; viii) Permitting parameter: in terms of the surface permitting (Private, State, Tribal, Federal) and mineral right (Private, State, Tribal, Federal) combinations; ix) Development potential: possible number of well per section; x) Official spacing: threshold appraisal spacing; xi) Number of sections; and xii) IP description parameter.

In step 1004, a geocellular model is automatically created using the number of sections stored in step 1002 and techniques well known in the art. Alternatively, the geocellular model may be created using the client interface and/or the video interface described further in reference to FIG. 16. The geocellular model includes a grid representing the number of sections.

In step 1006, the number of sections in the geocellular model created in step 1004, are populated with range names representing data values for the following property variables stored in step 1002 using well known anisotropic distribution techniques and using the client interface and/or the video interface described further in reference to FIG. 16: i) Geological: porosity, thickness, initial water saturation (Swi), initial oil formation volume factor (Boi), structural average depth, parameter to describe the proximity to the fault system; ii) Recovery attribute: primary recovery; iii) Surface distances: relative distance of section to the nearest roads, relative distance of section to the nearest roads, pipelines; iv) Permitting parameters, to describe the landlord types in term of surface and mineral right; v) Landform description parameters and vi) IP description parameter. Each range name thus, represents one or more data values for a respective property variable.

In step 1008, a matrix is built for the surface permitting and mineral right combinations using the data range name values for the permitting parameters from the geocellular model populated in step 1006. The matrix is used to manage the values from the statistical distribution modelled in step 1120 that replace the range names representing data values for the permitting parameters populated in step 1006 and to solve the AHRP formula in step 1126.

In step 1010, a curve-type production vector is built using the data values for the property variables stored in step 1002. A new range name is assigned to each time step in the production vector using well known techniques in the art, wherein each range name represents the probability of production at a respective time step. The method 1000 returns to step 2 in FIG. 1.

Figure 11A:
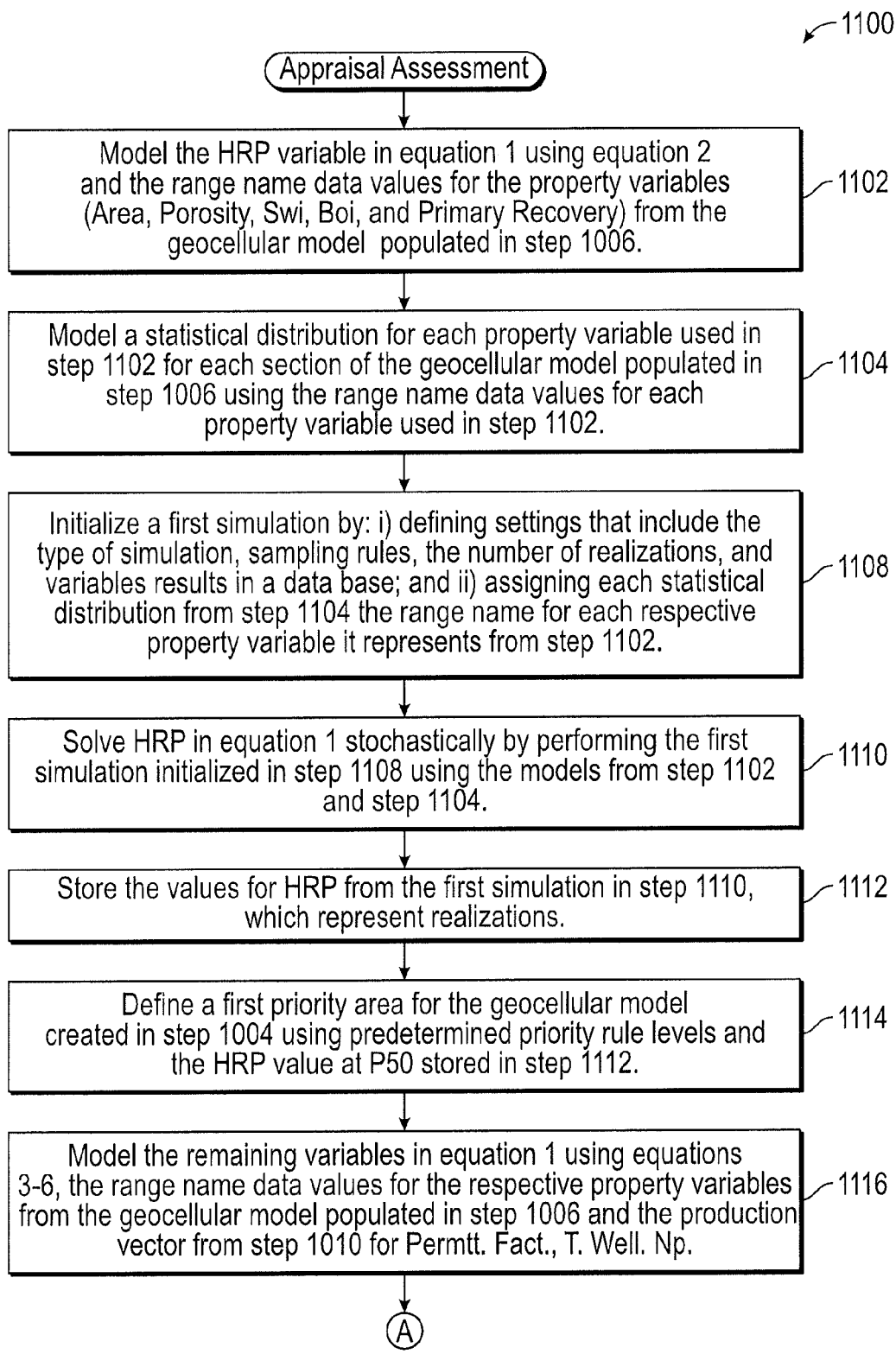
FIGS. 11A-11B are a flow diagram illustrating one embodiment of a method for performing step 2 in FIG. 1.
Figure 11B:
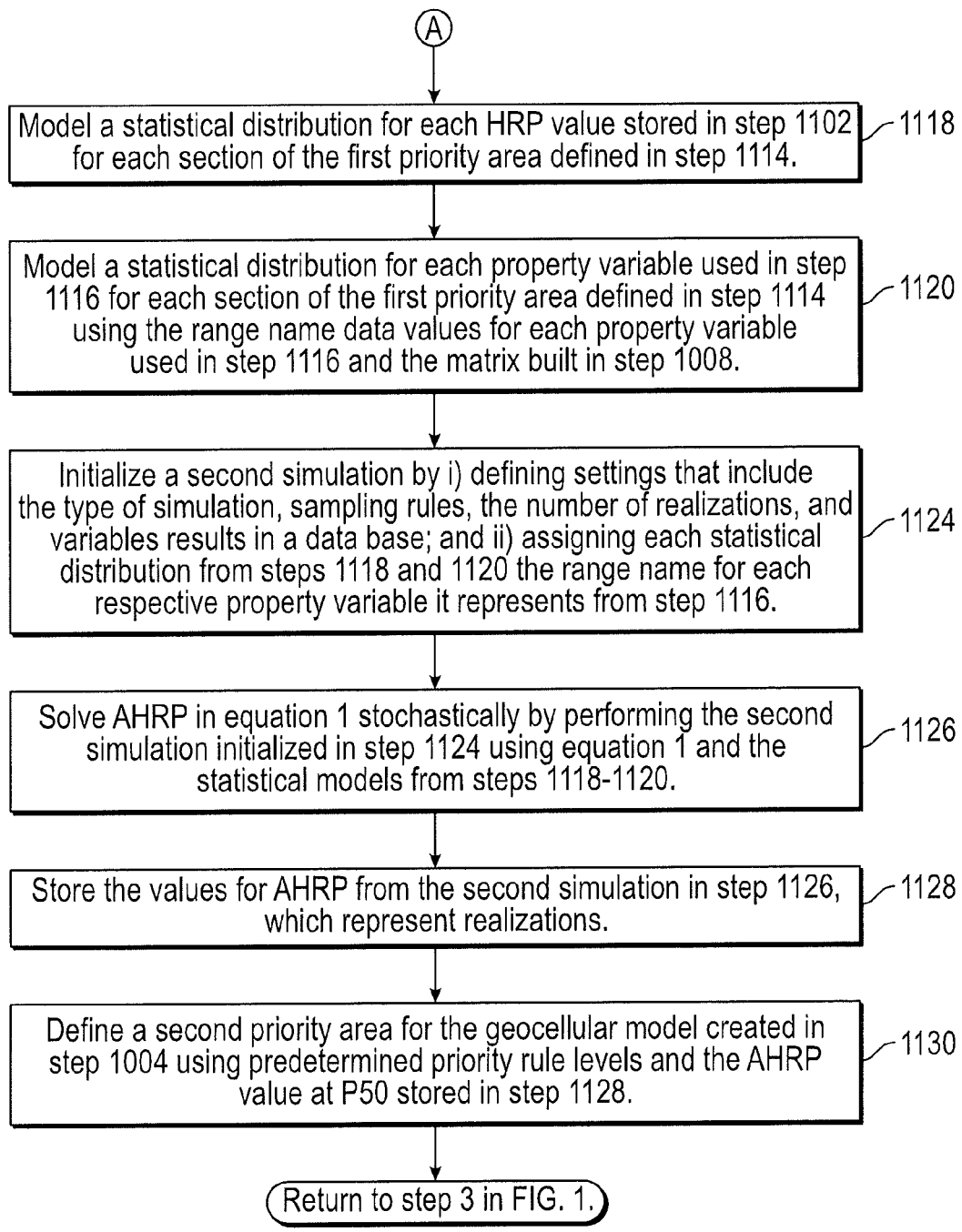

Referring now to FIGS. 11A-11B, a flow diagram of one embodiment of a method 1100 for performing step 2 in FIG. 1 is illustrated.

In step 1102, the HRP variable in equation 1 is modeled using equation 2, wherein HRP=f (Area, Porosity, Swi, Boi, Primary Recovery), the range name data values for the property variables (Area, Porosity, Swi, Boi, and Primary Recovery) from the geocellular model populated in step 1006, and techniques well known in the art.

In step 1104, a statistical distribution for each property variable used in step 1102 for each section of the geocellular model populated in step 1006 is modeled using the range name data values for each property variable used in step 1102 and techniques well known in the art. Each statistical distribution model represents the uncertainty of the property variables used in step 1102 for the geocellular model.

In step 1108, a first simulation is initialized by i) defining settings that include the type of simulation, sampling rules, the number of realizations, and variables results in a data base; and ii) assigning each statistical distribution from step 1104 the range name for each respective property variable it represents from step 1102.

In step 1110, HRP in equation 1 is stochastically solved by performing the first simulation initialized in step 1108 using the models from step 1102 and step 1104.

In step 1112, the values for HRP from the first simulation in step 1110, which represent realizations, are stored.

In step 1114, a first priority area is defined for the geocellular model created in step 1004 using predetermined priority rule levels based on techniques well known in the art, such as the Pareto method, the HRP value at P50 stored in step 1112 and using the client interface and/or the video interface described further in reference to FIG. 16.

In step 1116, the remaining variables in equation 1 are modeled using equations 3-6, wherein: i) Surf. Imp.=f (Permtt. Fact., Infraest. Fact); ii) Op. Imp.=f(T. Well. Np, PI fact., N. Wells, Op. Unit. C, Oil P.); iii) Well Imp.=f(Averg. Depth, Topo. Fact., N. Wells, Well.Unit. C, Oil P.); and iv) Opportunity Fact.=f(T. Opport., T. Risk), the range name data values for the respective property variables from the geocellular model populated in step 1006, the production vector from step 1010 for Permtt. Fact., T. Well. Np and techniques well known in the art. A range name is assigned to each dependent variable (i-iv) using techniques well known in the art.

In step 1118, a statistical distribution for each HRP value stored in step 1102 for each section of the first priority area defined in step 1114 is modeled using techniques well known in the art. Each statistical distribution model represents the uncertainty of the HRP values stored in step 1112.

In step 1120, a statistical distribution for each property variable used in step 1116 for each section of the first priority area defined in step 1114 is modeled using the range name data values for each property variable used in step 1116, the matrix built in step 1008 and techniques well known in the art. Each statistical distribution model represents the uncertainty of the remaining variables in equation 1 modeled in step 1116.

In step 1124, a second simulation is initialized by i) defining settings that include the type of simulation, sampling rules, the number of realizations, and variables results in a data base; and ii) assigning each statistical distribution from steps 1118 and 1120 the range name for each respective property variable it represents from step 1116.

In step 1126, AHRP in equation 1 is stochastically solved by performing the second simulation initialized in step 1124 using the equation 1 and the statistical models from steps 1118-1120.

In step 1128, the values for AHRP from the second simulation in step 1126, which represent realizations, are stored.

In step 1130, a second priority area is defined for the geocellular model created in step 1004 using predetermined priority rule levels based on techniques well known in the art, such as the Pareto method, the AHRP value at P50 stored in step 1128 and using the client interface and/or the video interface described further in reference to FIG. 16, As a result, the second priority area represents a subset of the first priority area defined in step 1114. The method 1100 returns to step 3 in FIG. 1.

Figure 12:
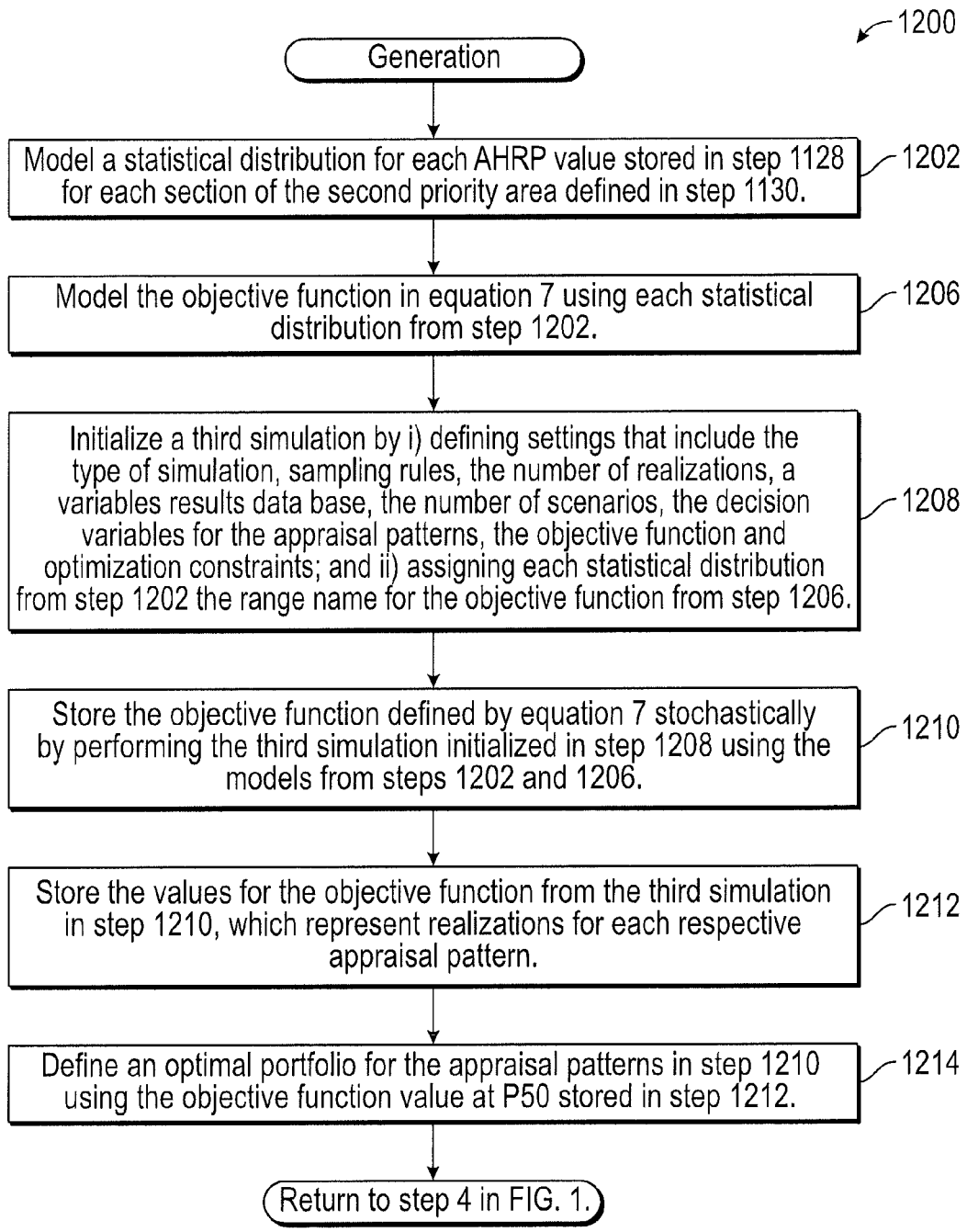
FIG. 12 is a flow diagram illustrating one embodiment of a method for performing step 3 in FIG. 1.

Referring now to FIG. 12, a flow diagram of one embodiment of a method 1200 for performing step 3 in FIG. 1 is illustrated.

In step 1202, a statistical distribution for each AHRP value stored in step 1128 for each section of the second priority area defined in step 1130 is modeled using techniques well known in the art. Each statistical distribution model represents the uncertainty of the AHRP values stored in step 1128.

In step 1206, the objective function in equation 7 is modeled using each statistical distribution from step 1202 and techniques well known in the art, wherein Obj. Funct.=f (SumAHRP(Xi, Yj))]. A range name is assigned to the objective function.

In step 1208, a third simulation is initialized by i) defining settings that include the type of simulation, sampling rules, the number of realizations, a variables results data base, the number of scenarios, the decision variables for the appraisal patterns, the objective function and optimization constraints; and ii) assigning each statistical distribution from step 1202 the range name for the objective function from step 1206.

In step 1210, the objective function defined by equation 7 is stochastically solved by performing the third simulation initialized in step 1208 using the models from steps 1202 and 1206. As a result, the value of the objective function at P50 is maximized.

In step 1212, the values for the objective function from the third simulation in step 1210, which represent realizations for each respective appraisal pattern, are stored.

In step 1214, an optimal portfolio is defined for the appraisal patterns in step 1210 using the objective function value at P50 stored in step 1212, using the client interface and/or the video interface described further in reference to FIG. 16 and techniques well known in the art such as the Efficient Frontier method. The method 1200 returns to step 4 in FIG. 1.

Figure 13:
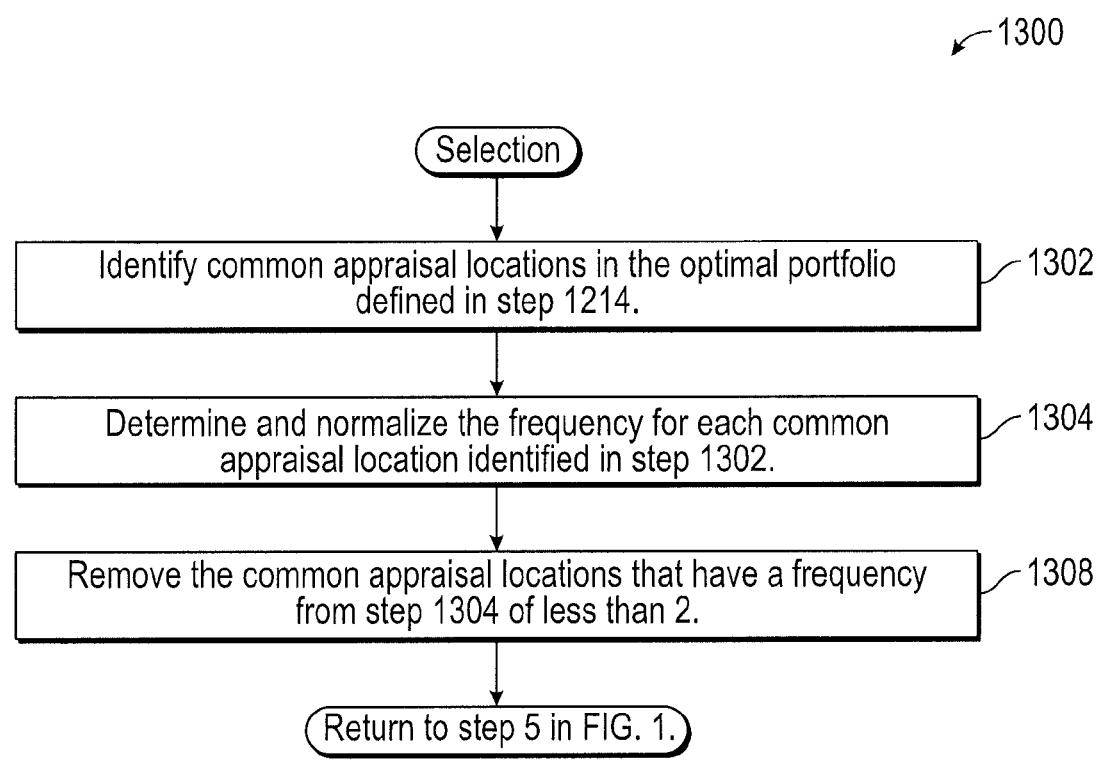
FIG. 13 is a flow diagram illustrating one embodiment of a method for performing step 4 in FIG. 1.

Referring now to FIG. 13, a flow diagram of one embodiment of a method 1300 for performing step 4 in FIG. 1 is illustrated.

In step 1302, common appraisal locations are identified in the optimal portfolio defined in step 1214 using the client interface and/or the video interface described further in reference to FIG. 16. The common appraisal locations in the optimal portfolio represent critical decisions.

In step 1304, the frequency for each common appraisal location identified in step 1302 is determined and normalized using any well-known statistical analysis. This step will measure the level of commonality, wherein the normalized frequency represents a weight factor (Wf).

In step 1308, the common appraisal locations that have a frequency from step 1304 of less than 2 are automatically removed or they may be removed using the client interface and/or the video interface described further in reference to FIG. 16. The method 1300 returns to step 5 in FIG. 1.

Figure 14:
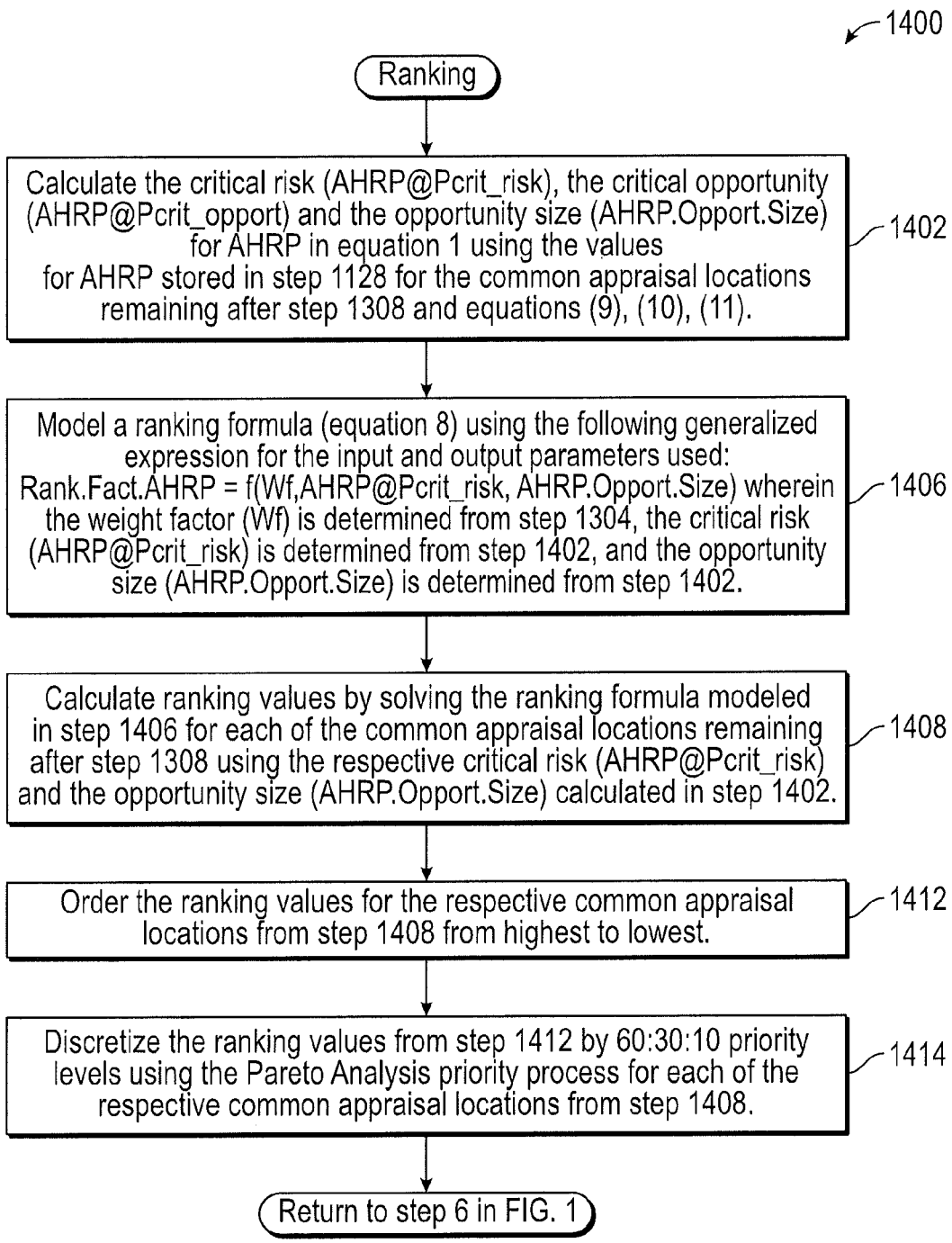
FIG. 14 is a flow diagram illustrating one embodiment of a method for performing step 5 in FIG. 1.

Referring now to FIG. 14, a flow diagram of one embodiment of a method 1400 for performing step 5 in FIG. 1 is illustrated.

In step 1402, the critical risk (AHRP@Pcrit_risk), the critical opportunity (AHRP@Pcrit_opport) and the opportunity size (AHRP.Opport.Size) for AHRP in equation 1 are automatically calculated using the values for AHRP stored in step 1128 for the common appraisal locations remaining after step 1308 and the following equations:

$$\text{AHRP.Opport.Size} = \text{AHRP@Pcrit\_opport} - \text{AHRP@Pcrit\_risk} \quad (9)$$

$$\text{AHRP@Pcrit\_risk} => \text{Pcrit\_risk} = \text{Lim Risk(AHRP)} = 0 \quad (10)$$

$$\text{AHRP@Pcrit\_opport} => \text{Pcrit\_opport} = \text{Lim Opport (AHRP)} = 0 \quad (11)$$

Alternatively, the critical opportunity, the critical risk and the opportunity size for AHRP in equation 1 may be calculated using the client interface and/or the video interface described further in reference to FIG. 16.

In step 1406, a ranking formula (equation 8) is modeled and the following generalized expression represents the input and output parameters used:

$$\text{Rank.Fact.AHRP} = f(\text{Wf}, \text{AHRP@Pcrit\_risk}, \text{AHRP.Opport.Size})$$

The weight factor (Wf) is determined from step 1304, the critical risk (AHRP@Pcrit_risk) is determined from step 1402, and the opportunity size (AHRP.Opport.Size) is determined from step 1402.

In step 1408, ranking values are calculated by solving the ranking formula modeled in step 1406 for each of the common appraisal locations remaining after step 1308 using the respective critical risk (AHRP@Pcrit_risk) and the opportunity size (AHRP.Opport.Size) calculated in step 1402.

In step 1412, the ranking values for the respective common appraisal locations from step 1408 are ordered from highest to lowest.

In step 1414, the ranking values from step 1412 are discretized by 60:30:10 priority levels using the Pareto Analysis priority process for each of the respective common appraisal locations from step 1408 using the client interface and/or the video interface described further in reference to FIG. 16. Each common appraisal location may be mapped in a geographic map using its corresponding priority code or tier number 3:2:1 and techniques well-known in the art. The tier number indicates the level of importance with 1 being the best and 3 being the worst. The method 1400 returns to step 6 in FIG. 1.

Figure 15:
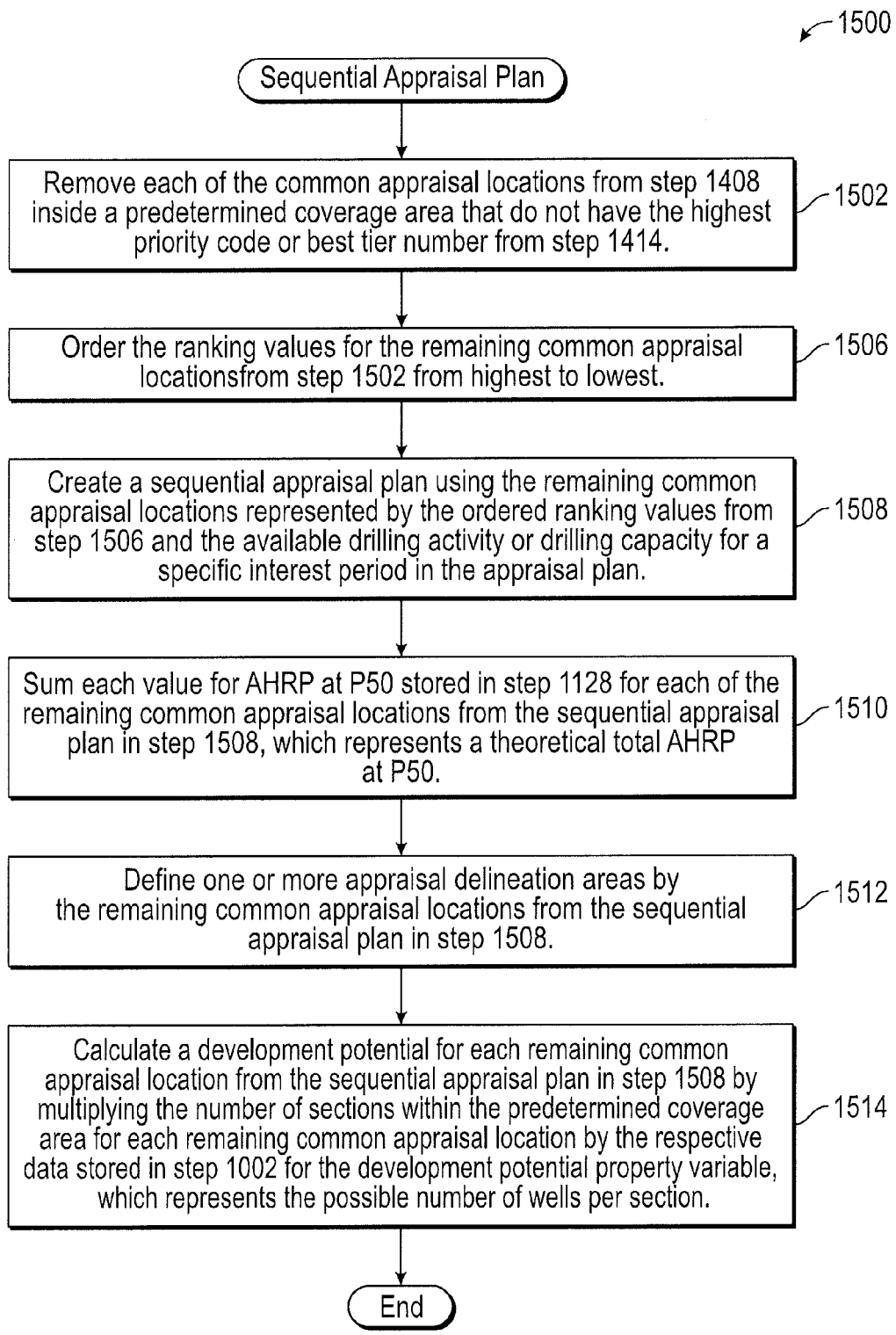
FIG. 15 is a flow diagram illustrating one embodiment of a method for performing step 6 in FIG. 1.

Referring now to FIG. 15, a flow diagram of one embodiment of a method 1500 for performing step 6 in FIG. 1 is illustrated.

In step 1502, each of the common appraisal locations from step 1408 inside a predetermined coverage area that do not have the highest priority code or best tier number from step 1414 are removed using the client interface and/or the video interface described further in reference to FIG. 16. The predetermined coverage area represents an area equidistantly surrounding each common appraisal location from step 1403 with the highest priority code or tier number.

In step 1506, the ranking values for the remaining common appraisal locations from step 1502 are ordered from highest to lowest using the client interface and/or the video interface described further in reference to FIG. 16.

In step 1508, a sequential appraisal plan is created using the remaining common appraisal locations represented by the ordered ranking values from step 1506 and the available drilling activity or drilling capacity for a specific interest period in the appraisal plan. This will define the total number of remaining common appraisal locations to be considered to appraise the whole area.

In step 1510, each value for AHRP at P50 stored in step 1128 for each of the remaining common appraisal locations from the sequential appraisal plan in step 1508 is automatically summed and represents a theoretical total AHRP at P50 (i.e. potential estimation of the proven reserves to be booked after the appraisal delineation of the field). Alternatively, each value for AHRP @ P50 for each of the remaining common appraisal locations may be summed using the client interface and/or the video interface described further in reference to FIG. 16.

In step 1512, one or more appraisal delineation areas are automatically defined by the remaining common appraisal locations from the sequential appraisal plan in step 1508. Alternatively, one or more appraisal delineation areas may be defined using the client interface and/or the video interface described further in reference to FIG. 16. Each appraisal delineation area includes at least one remaining common appraisal location and more if the remaining common appraisal locations have an overlapping predetermined coverage area. Each appraisal delineation area is constrained to the smallest area surrounding the predetermined coverage area for the one or more remaining common appraisal locations.

In step 1514, a development potential is automatically calculated for each remaining common appraisal location from the sequential appraisal plan in step 1508 by multiplying the number of sections within the predetermined coverage area for each remaining common appraisal location by the respective data stored in step 1002 for the development potential property variable, which represents the possible number of wells per section. Alternatively, the development potential may be calculated using the client interface and/or the video interface described further in reference to FIG. 16. The development potential represents the uncertainty of the possible number of wells to be drilled in each section.

System Description

The present disclosure may be implemented through a computer-executable program of instructions, such as program modules, generally referred to as software applications or application programs executed by a computer. The software may include, for example, routines, programs, objects, components and data structures that perform particular tasks or implement particular abstract data types. The software forms an interface to allow a computer to react according to a source of input. Decision Management Systems, which is a commercial software application marketed by Landmark Graphics Corporation, may be used as an interface application to implement the present disclosure. The software may also cooperate with other code segments to initiate a variety of tasks in response to data received in conjunction with the source of the received data. The software may be stored and/or carried on any variety of memory such as CD-ROM, magnetic disk, bubble memory and semiconductor memory (e.g. various types of RAM or ROM). Furthermore, the software and its results may be transmitted over a variety of carrier media such as optical fiber, metallic wire and/or through any of a variety of networks, such as the Internet.

Moreover, those skilled in the art will appreciate that the disclosure may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof, in a computer system or other processing system.

Referring now to FIG. 16, a block diagram illustrates one embodiment of a system for implementing the present disclosure on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the disclosure.

The memory primarily stores the application programs, which may also be described as program modules containing computer-executable instructions, executed by the computing unit for implementing the present disclosure described herein and illustrated in FIGS. 1-15. The memory therefore, includes an appraisal location module, which enables steps 2-5 described in reference to FIG. 1. The appraisal location module may integrate functionality from the remaining application programs illustrated in FIG. 16. In particular, Decision Management Systems may be used as an interface application to perform the remaining steps in FIG. 1 and to perform the progressive stochastic simulation in steps 2-3. Although Decision Management Systems may be used as interface application, other interface applications may be used, instead, or the appraisal location module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to, and/or presently being operated on, the processing unit. By way of example, and not limitation, the computing unit includes an operating system, application programs, other program modules, and program data.

The components shown in the memory may also be included in other removable/nonremovable, volatile/nonvolatile computer storage media or they may be implemented in the computing unit through an application program interface ("API") or cloud computing, which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/nonremovable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well-known.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure.

The invention claimed is:

1. A method for determining appraisal locations in a reservoir system, which comprises:
   creating a geocellular model using a computer processor;
   defining a first priority area for the geocellular model using predetermined priority rule levels and one of a plurality of hydrocarbon recovery production values determined by a first simulation;
   defining a second priority area for the geocellular model using predetermined priority rule levels and one of a plurality of adjusted hydrocarbon recovery production values determined by a second simulation based on the first priority area, wherein the second priority area is constrained by the first priority area;
   defining an optimal portfolio for one or more appraisal patterns determined by a third simulation based on the second priority area using one of a plurality of objective function values determined by the third simulation, wherein the optimal portfolio is constrained by the second priority area;
   identifying common appraisal locations in the optimal portfolio;
   calculating a ranking value for each respective common appraisal location using a respective critical risk and opportunity size;
   discretizing each ranking value by predetermined priority levels;
   removing each of the common appraisal locations inside a predetermined coverage area that do not have a highest priority level, the common appraisal locations inside the predetermined coverage area that have the highest priority level representing all remaining common appraisal locations; and
   creating a sequential appraisal plan using the remaining common appraisal locations and at least one of available drilling activity and drilling capacity for a specified interest period of the sequential appraisal plan.

2. The method of claim 1, wherein the one of the plurality of hydrocarbon recovery production values, the one of the plurality of adjusted hydrocarbon recovery production values and the one of the plurality of objective function values are the respective value at P50.

3. The method of claim 1, further comprising:
   determining a frequency for each common appraisal location; and
   normalizing the frequency of each common appraisal location.

4. The method of claim 3, further comprising removing the common appraisal locations with a normalized frequency of less than 2.

5. The method of claim 1, wherein the highest priority level is represented by a best tier number.

6. The method of claim 2, further comprising summing each adjusted hydrocarbon recovery potential value at P50 for each of the remaining common appraisal locations from the sequential appraisal plan.

7. The method of claim 1, further comprising defining one or more appraisal delineation areas by the remaining common appraisal locations from the sequential appraisal plan.

8. The method of claim 1, further comprising calculating a development potential for each remaining common appraisal location from the sequential appraisal plan by multiplying a number of sections within the predetermined coverage area for each remaining common appraisal location by a respective data value that represents a possible number of wells per section.

9. A non-transitory program carrier device tangibly carrying computer-executable instructions for determining appraisal locations in a reservoir system, the instructions being executable to implement:
creating a geocellular model;
defining a first priority area for the geocellular model using predetermined priority rule levels and one of a plurality of hydrocarbon recovery production values determined by a first simulation;
defining a second priority area for the geocellular model using predetermined priority rule levels and one of a plurality of adjusted hydrocarbon recovery production values determined by a second simulation based on the first priority area, wherein the second priority area is constrained by the first priority area;
defining an optimal portfolio for one or more appraisal patterns determined by a third simulation based on the second priority area using one of a plurality of objective function values determined by the third simulation, wherein the optimal portfolio is constrained by the second priority area;
identifying common appraisal locations in the optimal portfolio;
calculating a ranking value for each respective common appraisal location using a respective critical risk and opportunity size;
discretizing each ranking value by predetermined priority levels;
removing each of the common appraisal locations inside a predetermined coverage area that do not have a highest priority level, the common appraisal locations inside the predetermined coverage area that have the highest priority level representing all remaining common appraisal locations; and
creating a sequential appraisal plan using the remaining common appraisal locations and at least one of available drilling activity and drilling capacity for a specified interest period of the sequential appraisal plan.

10. The program carrier device of claim 9, wherein the one of the plurality of hydrocarbon recovery production values, the one of the plurality of adjusted hydrocarbon recovery production values and the one of the plurality of objective function values are the respective value at P50.

11. The program carrier device of claim 9, further comprising:
determining a frequency for each common appraisal location; and
normalizing the frequency of each common appraisal location.

12. The program carrier device of claim 11, further comprising removing the common appraisal locations with a normalized frequency of less than 2.

13. The program carrier device of claim 9, wherein the highest priority level is represented by a best tier number.

14. The program carrier device of claim 10, further comprising summing each adjusted hydrocarbon recovery potential value at P50 for each of the remaining common appraisal locations from the sequential appraisal plan.

15. The program carrier device of claim 9, further comprising defining one or more appraisal delineation areas by the remaining common appraisal locations from the sequential appraisal plan.

16. The program carrier device of claim 9, further comprising calculating a development potential for each remaining common appraisal location from the sequential appraisal plan by multiplying a number of sections within the predetermined coverage area for each remaining common appraisal location by a respective data value that represents a possible number of wells per section.

17. A non-transitory program carrier device tangibly carrying computer-executable instructions for determining appraisal locations in a reservoir system, the instructions being executable to implement:
creating a geocellular model;
defining a first priority area for the geocellular model using predetermined priority rule levels and one of a plurality of hydrocarbon recovery production values determined by a first simulation;
defining a second priority area for the geocellular model using predetermined priority rule levels and one of a plurality of adjusted hydrocarbon recovery production values determined by a second simulation based on the first priority area, wherein the second priority area is constrained by the first priority area;
defining an optimal portfolio for one or more appraisal patterns determined by a third simulation based on the second priority area using one of a plurality of objective function values determined by the third simulation, wherein the optimal portfolio is constrained by the second priority area;
identifying common appraisal locations in the optimal portfolio;
calculating a ranking value for each respective common appraisal location;
discretizing each ranking value by predetermined priority levels;
removing each of the common appraisal locations inside a predetermined coverage area that do not have a highest priority level, the common appraisal locations inside the predetermined coverage area that have the highest priority level representing all remaining common appraisal locations;
creating a sequential appraisal plan using the remaining common appraisal locations and at least one of available drilling activity and drilling capacity for a specified interest period of the sequential appraisal plan; and
defining one or more appraisal delineation areas by the remaining common appraisal locations from the sequential appraisal plan.

18. The program carrier device of claim 17, wherein the one of the plurality of hydrocarbon recovery production values, the one of the plurality of adjusted hydrocarbon recovery production values and the one of the plurality of objective function values are the respective value at P50.

19. The program carrier device of claim 17, further comprising:
determining a frequency for each common appraisal location; and
normalizing the frequency of each common appraisal location.

20. The program carrier device of claim 19, further comprising removing the common appraisal locations with a normalized frequency of less than 2.

\* \* \* \* \*